(12) United States Patent
Zanchi et al.

(10) Patent No.: US 7,907,074 B2
(45) Date of Patent: Mar. 15, 2011

(54) CIRCUITS AND METHODS TO REDUCE OR ELIMINATE SIGNAL-DEPENDENT MODULATION OF A REFERENCE BIAS

(75) Inventors: Alfio Zanchi, Colorado Springs, CO (US); David M. Thomas, Colorado Springs, CO (US); Joseph L. Sousa, Lawrence, MA (US); Andrew J. Thomas, Arlington, MA (US); Jesper Steensgaard-Madsen, Mountain View, CA (US)

(73) Assignee: Linear Technology Corporation, Milpitas, CA (US)

( * ) Notice: Subject to any disclaimer, the term of this patent is extended or adjusted under 35 U.S.C. 154(b) by 78 days.

(21) Appl. No.: 12/287,623

(22) Filed: Oct. 9, 2008

(65) Prior Publication Data
US 2009/0121912 A1  May 14, 2009

Related U.S. Application Data

(60) Provisional application No. 61/002,495, filed on Nov. 9, 2007.

(51) Int. Cl.
*H03M 1/12* (2006.01)

(52) U.S. Cl. ........ 341/155; 341/118; 341/120; 341/144; 341/172; 323/268; 323/273; 323/280; 323/282

(58) Field of Classification Search .......... 341/118–122, 341/155, 172; 323/268, 273, 280, 282
See application file for complete search history.

(56) References Cited

U.S. PATENT DOCUMENTS

| | | | | |
|---|---|---|---|---|
| 5,825,321 A | * | 10/1998 | Park | 341/144 |
| 6,046,577 A | * | 4/2000 | Rincon-Mora et al. | 323/282 |
| 6,465,994 B1 | * | 10/2002 | Xi | 323/274 |
| 6,677,735 B2 | * | 1/2004 | Xi | 323/273 |
| 6,859,157 B1 | * | 2/2005 | Gunther | 341/144 |
| 6,930,622 B2 | * | 8/2005 | Brede et al. | 341/80 |
| 6,972,703 B1 | * | 12/2005 | Yen et al. | 341/136 |
| 7,095,356 B1 | * | 8/2006 | Pentakota et al. | 341/172 |
| 7,151,472 B2 | * | 12/2006 | Huang et al. | 341/122 |
| 7,327,166 B2 | | 2/2008 | Zanchi et al. | |
| 7,456,619 B2 | * | 11/2008 | Sasaki et al. | 323/274 |
| 7,847,530 B2 | * | 12/2010 | Takagi | 323/280 |
| 2007/0182399 A1 | * | 8/2007 | Enjalbert | 323/315 |
| 2009/0224737 A1 | * | 9/2009 | Lou | 323/280 |
| 2010/0066320 A1 | * | 3/2010 | Dasgupta et al. | 323/273 |

OTHER PUBLICATIONS

Ahmed Ali, et al., "A 14-bit 125 MS/s IF/RF Sampling Pipelined ADC with 100 dB SFDR and 50 fs Jitter," IEEE Journal of Solid-State Circuits, vol. 41, No. 8, Aug. 2006, pp. 1846-1855.

Zanchi, Alfio and Frank (Ching-Yuh) Tsay, "A 16-bit 65-MS/s 3.3-V Pipeline ADC Core in SiGe BiCMOS with 78-dB SNR and 180-fs Jitter," IEEE Journal of Solid-State Circuits, vol. 40, No. 6, Jun. 2005, pp. 1225-1237.

\* cited by examiner

*Primary Examiner* — Linh V Nguyen
(74) *Attorney, Agent, or Firm* — McDermott Will & Emery LLP

(57) ABSTRACT

Circuits and methods that improve the performance of voltage reference driver circuits and associated analog to digital converters are provided. A voltage reference driver circuit that maintains a substantially constant output voltage when a load current is modulated by an input signal is provided. The voltage reference driver circuit synchronously decouples a voltage regulation circuit from the load circuit when modulating events such as pulses caused by the load circuit during a switching interval are generated, preventing disturbance of the regulation circuitry and keeping its output voltage substantially constant.

58 Claims, 10 Drawing Sheets

| Column 1 | Column 2 | Column 3 | Column 4 |
|---|---|---|---|
| Bit number | Weighting factor | Charge drawn (1) | Charge drawn (2) |
| 1 | 1/2 | 64pC | 64pC |
| 2 | 1/4 | 32pC | 32pC |
| 3 | 1/8 | 16pC | 16pC |
| 4 | 1/16 | 8pC | 8pC |
| 5 | 1/32 | 4pC | 4pC |
| 6 | 1/64 | 2pC | 2pC |
| 7 | 1/128 | 1pC | 1pC |
| 8 | 1/256 | 1/2pC | 1/2pC |
| 9 | 1/512 | 1/4pC | 16pC |
| 10 | 1/1024 | 1/8pC | 8pC |
| 11 | 1/2048 | 1/16pC | 4pC |
| 12 | 1/4096 | 1/32pC | 2pC |
| 13 | 1/8192 | 1/64pC | 1pC |
| 14 | 1/16384 | 1/128pC | 1/2pC |

CIRCUITS AND METHODS TO REDUCE OR ELIMINATE SIGNAL-DEPENDENT MODULATION OF A REFERENCE BIAS

PRIORITY CLAIM

This application claims priority from U.S. provisional application Ser. No. 61/002,495 filed Nov. 9, 2007.

BACKGROUND OF THE INVENTION

This invention relates to electronic reference circuitry. More particularly, the invention relates to voltage reference drivers that provide a substantially constant output voltage when periodically coupled to a reactive load.

Voltage references have been widely used in electronics applications for many years. The purpose of a voltage reference is to provide a stable voltage that is substantially independent of external stimuli, such as variations in temperature, power supply voltage, and loading conditions. Such references form a vital part of numerous commonly used circuits, such as analog to digital (ADC) and digital to analog (DAC) converters, phase-locked loops, voltage regulators, comparison circuits, etc.

In the case of analog to digital converters, voltage reference circuitry is used to provide a voltage from which comparisons are made in order to quantize a sampled analog signal into the digital domain. For example, a sampled analog input signal may be compared in succession to multiple voltage levels, which are based in part on the reference voltage. The outcome of these comparisons is used to create a digital word which represents a digital value of the sampled analog signal. Such converters are known in the art as Successive Approximation Register converters (SARs).

One popular type of SAR is the charge redistribution SAR which uses a charge-scaling DAC to provide selected fractions of the reference voltage by way of voltage division. This is typically implemented as an array of individually switched capacitors which combine to produce sums of binary-weighted fractions of the reference voltage. The sum of the input signal and the selected fractions of the reference voltage are successively compared to a preset level (e.g., ground) to produce comparison bits that are combined to produce a digital word representing the sampled analog input signal.

In order for the charge-scaling DAC described above to operate with the desired precision, it is important that the reference voltage used to synthesize the DAC output, which is to be weighted against the sampled analog input signal, remains substantially constant. Variation of the reference voltage can introduce comparison errors, resulting in the creation of imprecise or inaccurate digital words, and thus limit the degree of resolution achievable with a given converter architecture.

Accordingly, numerous schemes for maintaining a substantially constant reference voltage in both DAC and ADC circuits have been proposed. Because the charge-scaling DAC in a successive approximation ADC switches some or all of its capacitors to the reference voltage in response to the sampled analog signal value, there may be a non-trivial inrush current drawn from the voltage reference circuit. This inrush current creates transient spikes on the reference circuit's output voltage. The spikes themselves may not necessarily be detrimental to the ADC's overall operation and precision, provided that the reference voltage settles substantially to its nominal value by the time the selected fractions thereof are compared to the sampled analog signal value. However, if the inrush currents and the transient spikes are influenced by the sampled input signal, which typically is the case, the reference voltage may be modulated by the sampled input signal and a distortion of the corresponding digital values may result.

Depending on the physical implementation of the circuitry, there may be a relatively complicated relationship between the input signal under conversion, the inrush currents, the transient spikes, and the distortion induced by the inrush currents. Distortion induced by the inrush currents may adversely affect the analog to digital conversion, and thus it is desirable to design the reference voltage circuitry such that the reference voltage is substantially independent of inrush currents.

Thus, in view of the above, it would be desirable to provide circuitry and methods that maintain a substantially constant output voltage when such circuitry is periodically coupled to a reactive load causing transient spikes that may be influenced by an input signal.

It would also be desirable to provide circuitry and methods that maintain a substantially constant output voltage driving a switched-capacitor DAC.

SUMMARY OF THE INVENTION

Circuits and methods that improve the performance of voltage reference circuits are provided. A voltage reference driver circuit maintains a substantially constant output voltage level when coupled to a switched reactive load. The voltage reference driver circuit decouples a voltage regulation loop from the load at or before each occurrence of voltage spikes or pulses on the reference driver circuit's output. The synchronous decoupling substantially prevents the regulation circuitry from being disturbed by load-induced transients, and thus maintains a substantially constant output voltage which is substantially independent of an input signal.

In one embodiment of the present invention, a voltage reference driver circuit is provided that supplies a substantially constant output voltage to a load, and includes a voltage regulation circuit that generates a substantially constant voltage, a buffer circuit coupled to the voltage regulation circuit, the buffer circuit providing the substantially constant output voltage to the load based on the substantially constant voltage generated by the voltage regulation circuit; and, an isolation circuit coupled to the voltage regulation circuit and the buffer circuit for selectively disconnecting the buffer circuit from the voltage regulation circuit at or before the occurrence of modulating pulses induced by the load.

In another embodiment of the present invention, an analog to digital conversion circuit having improved accuracy when sampling and converting an input signal from the analog domain to the digital domain is provided which includes a digital to analog converter circuit having a plurality of switched capacitors, such as, but not limited to, approximation capacitors, a voltage reference driver circuit coupled to the digital to analog converter circuit and configured to provide a substantially constant output voltage to the plurality of switched capacitors, the voltage reference driver circuit including a voltage regulation circuit that generates a substantially constant voltage, a buffer circuit coupled to the voltage regulation circuit, the buffer circuit providing the substantially constant output voltage to the plurality of switched capacitors based on the substantially constant voltage generated by the voltage regulation circuit, an isolation circuit coupled to the voltage regulation circuit and the buffer circuit for selectively disconnecting the buffer circuit from the voltage regulation circuit at or before the occurrence of a pulse induced by switching the plurality of switched capacitors, and wherein selectively disconnecting the buffer circuit substantially reduces or eliminates the pulse from propagating to the voltage regulation circuit, reducing drift on the substantially constant output voltage and thereby improving accuracy of the analog to digital converter.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which:

FIG. 7B is a chart illustrating the weighting factors and the charge drawn by both a true binary weighted charge-scaling DAC and a segmented charge-scaling DAC;

DETAILED DESCRIPTION OF THE INVENTION

Figure 2:
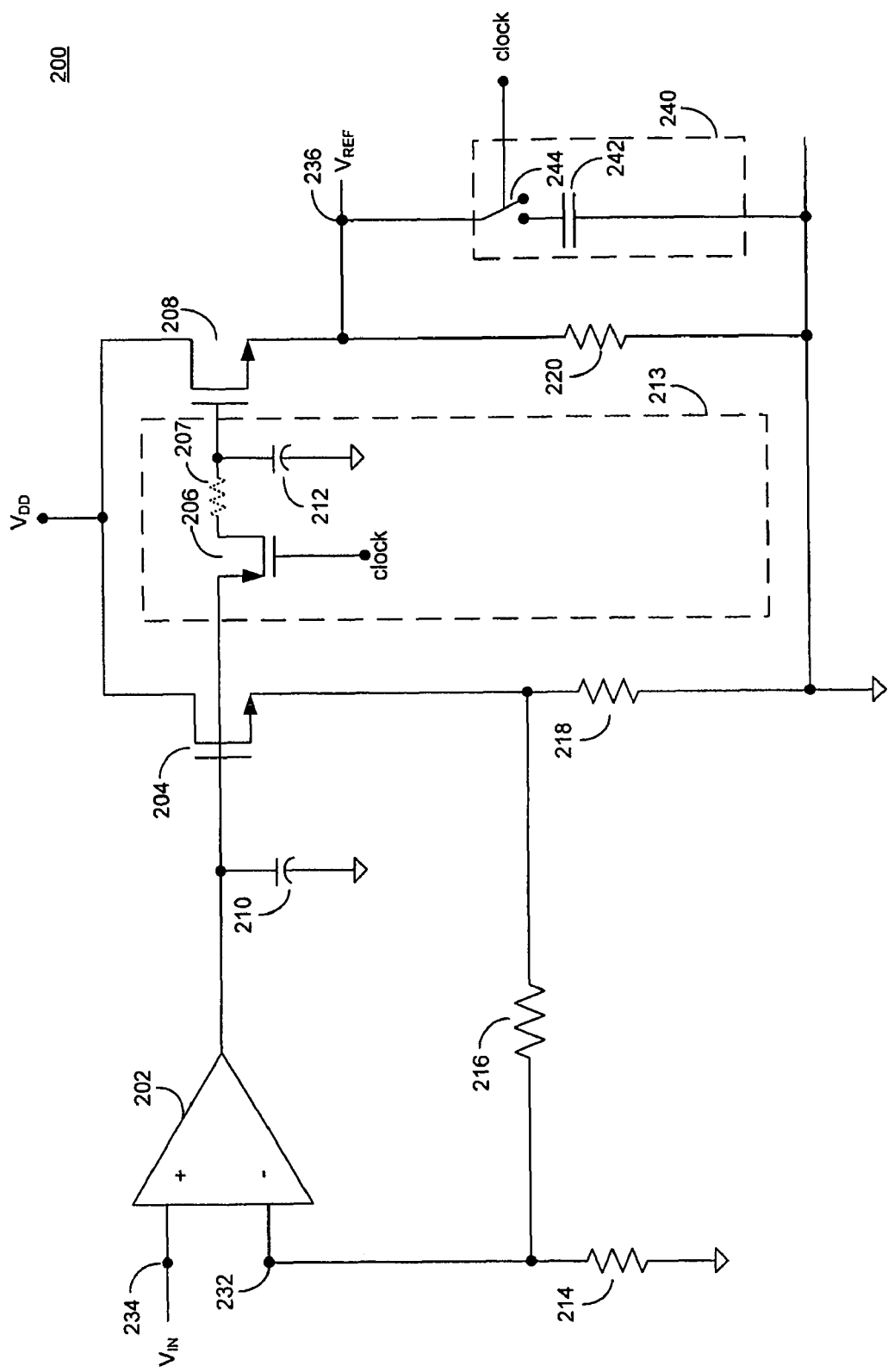
FIG. 2 is a schematic diagram of one embodiment of a voltage reference driver circuit constructed in accordance with the principles of the present invention.

A schematic diagram of one embodiment of a voltage reference driver circuit 200 constructed in accordance with the principles of present invention is shown in FIG. 2. As shown, reference driver circuit 200 generally includes an amplifier circuit 202, NMOS transistors 204 and 208, a switch 206, such as a PMOS transistor, optional resistor 207, capacitors 210 and 212, resistors 214, 216, 218, 220 and load circuit 240. Load circuit 240 is a simplified representation of a generic switched-capacitor load and includes capacitor 242 and switch 244. Load circuit 240 is not part of reference driver circuit 200, and is shown to illustrate that the circuit 200 may drive some type of switched capacitor load that may cause transients to occur at the output terminal 236.

Load circuit 240 may draw one or more charge pulses from the driver circuit's output terminal 236 when capacitors are periodically switched into and out of load 240 (referred to as "switching intervals"). After the completion of a switching interval, a "regulation interval" occurs wherein circuit 200 may be biased in preparation to provide the desired voltage level during a subsequent switching interval. In some embodiments, circuit 200 may maintain the voltage on load 240 substantially constant during such regulation intervals. It will be understood that the reference driver circuit 200 may be used to drive different types of loads, and that it may drive more than one load circuit in any one application.

In operation, reference driver circuit 200 may provide a substantially constant output voltage $V_{REF}$ (sometimes referred to as $V_{OUT}$) at node 236 to switched capacitor load 240. When one or more capacitive loads are coupled to node 236 during a switching interval, they will be charged to a substantially constant voltage. In some embodiments, this includes the case where load circuit 240 is a charge-scaling DAC employed in a successive approximation or a pipeline ADC. Specific types of DAC and ADC circuit topologies that may benefit from the present invention, include, but are not limited to, flash DACs and ADCs, multi-step (residue-producing) ADCs including pipeline ADCs, Delta-Sigma DACs and ADCs, SAR ADCs, sub-ranging ADCs, folding ADC architectures, multiplying DACs (MDACs), etc.

For successive-approximation ADCs and many other discrete-time systems, it is primarily the reference voltage's value at certain discrete points in time that affect the overall level of performance. Accordingly, as used herein, the term "reference voltage" shall mean the voltage provided by the reference voltage circuitry at certain discrete points in time in connection with obtaining the benefits and performance goals further described herein, and not necessarily at all or arbitrary points in time.

Initially, a reference input voltage $V_{IN}$ is provided to the non-inverting terminal 234 of amplifier 202. This voltage may be used to establish the voltage level provided by driver circuit 200 at node 236. For example, the input to terminal 234 may be from a bandgap voltage reference or other known fixed voltage source (not shown). Because driver circuit 200 does not draw substantial charge pulses from terminal 234, it simplifies the connection with load circuit 240. The output voltage of amplifier 202 is controlled by a feedback network formed by NMOS transistor 204 and resistors 214, 216 and 218. Capacitor 210 may be included to compensate the frequency response of the negative feedback loop, such as to ensure stability. Amplifier 202 may be selected to have high gain, and NMOS transistors 204 and 208 may be selected to have a predefined ratio and similar operating conditions to facilitate precise voltage regulation.

As shown in FIG. 2, the output of amplifier 202 is further coupled to the gate of NMOS transistor 208 via PMOS transistor 206 that implements a switch. During a regulation interval, when PMOS switch 206 is conductive, capacitor 212 is charged to the voltage provided by amplifier 202. Transistor 208 and resistor 220 form a buffer circuit providing the output signal $V_{REF}$ to output node 236. In certain embodiments, the buffer circuit may be selected to provide an appropriate low output impedance necessary to maintain the output voltage substantially constant and drive capacitive load 240 at high switching frequencies. Moreover, capacitor 212 may be coupled to the gate of NMOS transistor 208 to maintain a bias signal during switching intervals (discussed in more detail below).

Figure 3:
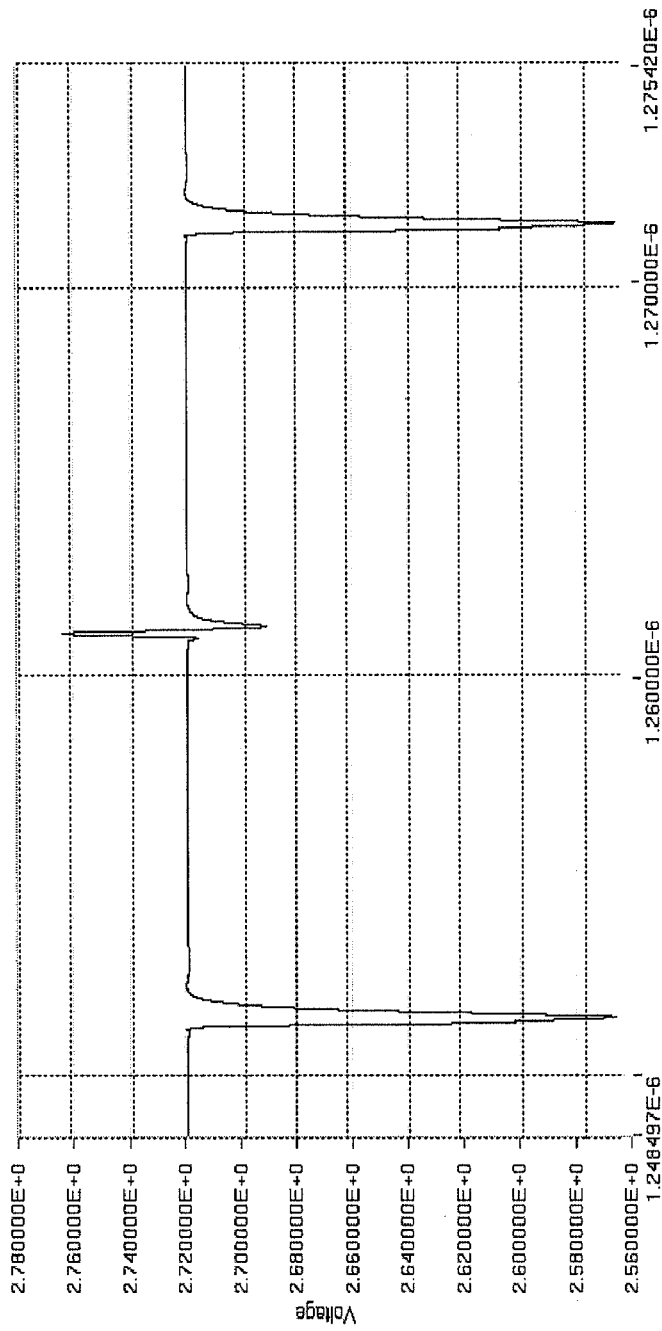
FIG. 3 is a graph illustrating voltage spikes induced by a switched capacitor load that may occur on the voltage reference driver circuit's output during switching intervals.

In the case where output node 236 is connected to switched capacitor load circuits, such as those associated with some analog to digital converters, voltage spikes may occur when one or more capacitors are coupled to output node 236 during switching intervals (generally shown in FIG. 3). These voltage spikes may include voltage troughs or peaks associated with charging those capacitors. The effects of such voltage spikes may propagate through the gate of NMOS transistor 208 and back into the voltage regulation loop formed by amplifier 202, capacitor 210, NMOS transistor 204 and resistors 214, 216 and 218.

Such propagating voltage spikes may disturb the voltage regulation loop, and cause an undesired drift in the output voltage $V_{REF}$ on node 236. For some applications, such as SAR ADCs, the voltage spikes may be related to an analog input signal applied to the ADC, and the potential drift of $V_{REF}$ may cause distortion and impede the SAR ADC's performance and accuracy.

Figure 1:
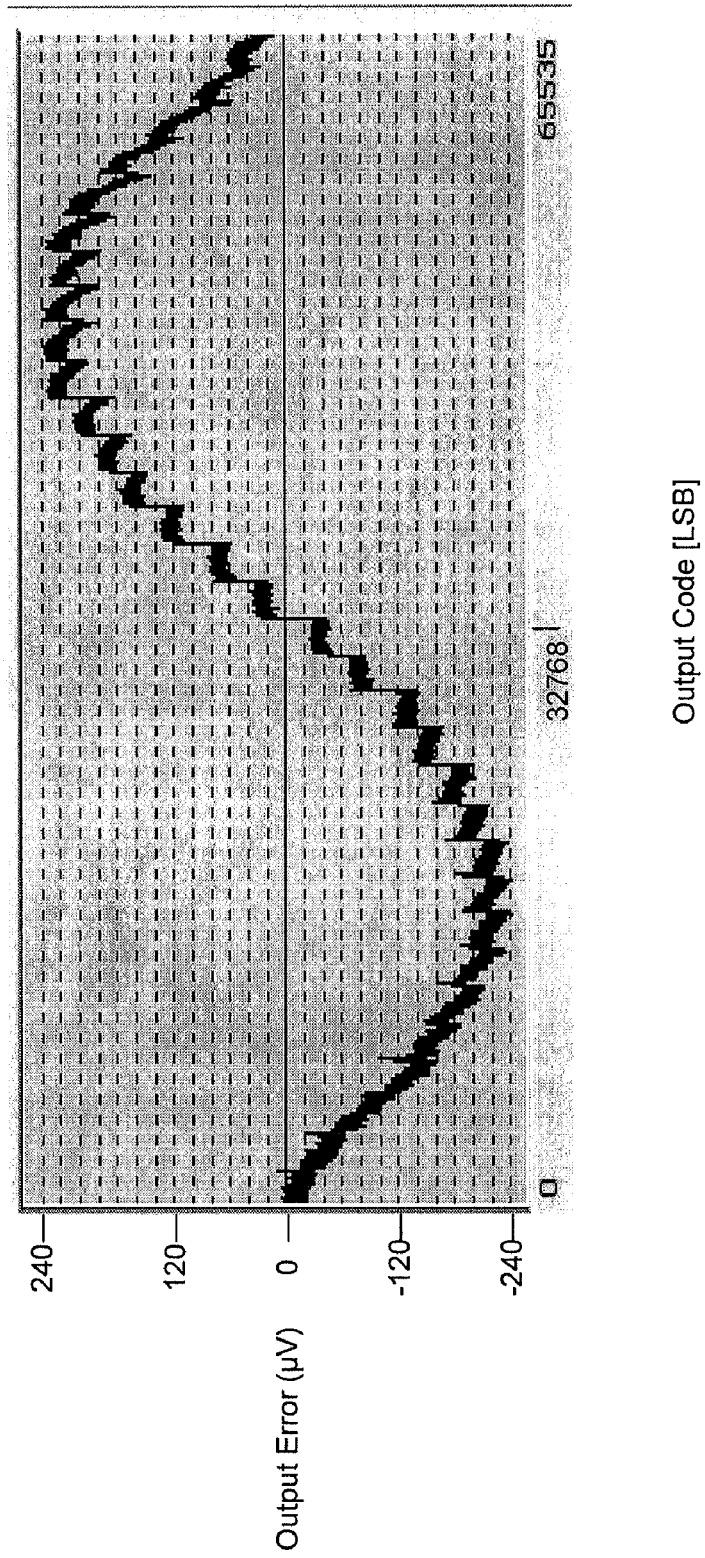
FIG. 1 is a sample graph illustrating a detrimental effect on the output of an ADC caused by a drift in the reference voltage as allowed by prior art voltage reference circuits.

In some embodiments, this phenomena may manifest itself with particularity when the voltage spikes are modulated by a bias signal at relatively low frequencies. For example, FIG. 1 shows integral non-linearity (INL) measurement results for an analog to digital converter obtained using a conventional histogram method for an applied low-frequency sinusoidal test signal. The observed INL error is caused, in part, by a signal-dependent drift in the reference voltage provided by a prior-art reference voltage driver circuit interfacing the ADC.

One way to correct (or circumvent) this problem is to decouple or disconnect the circuitry causing the voltage spikes from the control loop at or before their occurrence. This prevents the perturbation caused by the voltage spikes from propagating back to the control loop and affecting voltage regulation. This may be accomplished by controlling PMOS switch 206 to be substantially nonconductive (OFF) at times when voltage spikes may occur at the output node 236.

For example, in operation, the gate of PMOS transistor 206 may be coupled to a control signal provided by a clock or timing circuit that may also control the switching of switched capacitor load 240 such that the two operate in a substantially synchronous fashion (not shown). Thus, just before the load 240 is switched, which may cause a voltage spike at the output 236, PMOS transistor 206 is turned OFF, isolating the control loop from the buffer circuit (such as that formed by NMOS transistor 208 providing transconductance and resistor 220), thus preventing any ensuing spike and its effects from being substantially transferred to the control loop. In some embodiments, some additional propagation delay circuitry may be added to the control signal to ensure proper switch timing (not shown). While PMOS switch transistor 206 is OFF, capacitor 212 maintains the charge isolated on the gate of NMOS transistor 208 and ensures that output node 236 settles to the desired voltage after each spike. The period during which NMOS 208 is disconnected from the rest of reference driver circuit 200 (i.e., when PMOS switch 206 is OFF) may be referred to herein as a switching interval.

In some embodiments, optional resistor 207 may be provided as an additional protection to attenuate any spikes that may occur prior to and/or shortly after a switching interval (e.g., due to unpredictable load conditions or incomplete settling). Optional resistor 207 may also serve to reduce noise components in $V_{REF}$ contributed by amplifier 202, NMOS 204, resistors 214, 216, 218 and/or the externally applied voltage $V_{IN}$. If desired, optional resistor 207 may be split in two and provided on either or both sides of PMOS switch 206 (not shown). Moreover, in certain embodiments, the drain terminals of NMOS transistor 204 and NMOS 208 may be coupled to different (or isolated) voltage sources $V_{DD}$ in order to further decouple the voltage control loop from the buffer circuit (not shown).

When all anticipated spikes have subsided sufficiently (e.g., based on the desired accuracy of the reference circuit), PMOS switch 206 is turned back ON by the control signal, and the buffer circuit is reconnected to the control loop. At that time, capacitor 212 will have substantially the same voltage across it as it had prior to its disconnection (it loses virtually no charge through the gate of NMOS transistor 208), and hence the control loop will be only minimally disturbed by reconnecting capacitor 212 to the output of amplifier 202.

Accordingly, the control loop will be substantially unaffected by the spikes induced by the load circuit 240 and/or by operating PMOS switch 206, resulting in superior voltage regulation.

Thus, when circuit 200 is deployed in an analog to digital converter, the distortion effects caused by the analog input signal modulating the reference voltage $V_{REF}$ in the prior art are substantially circumvented.

Figure 4:
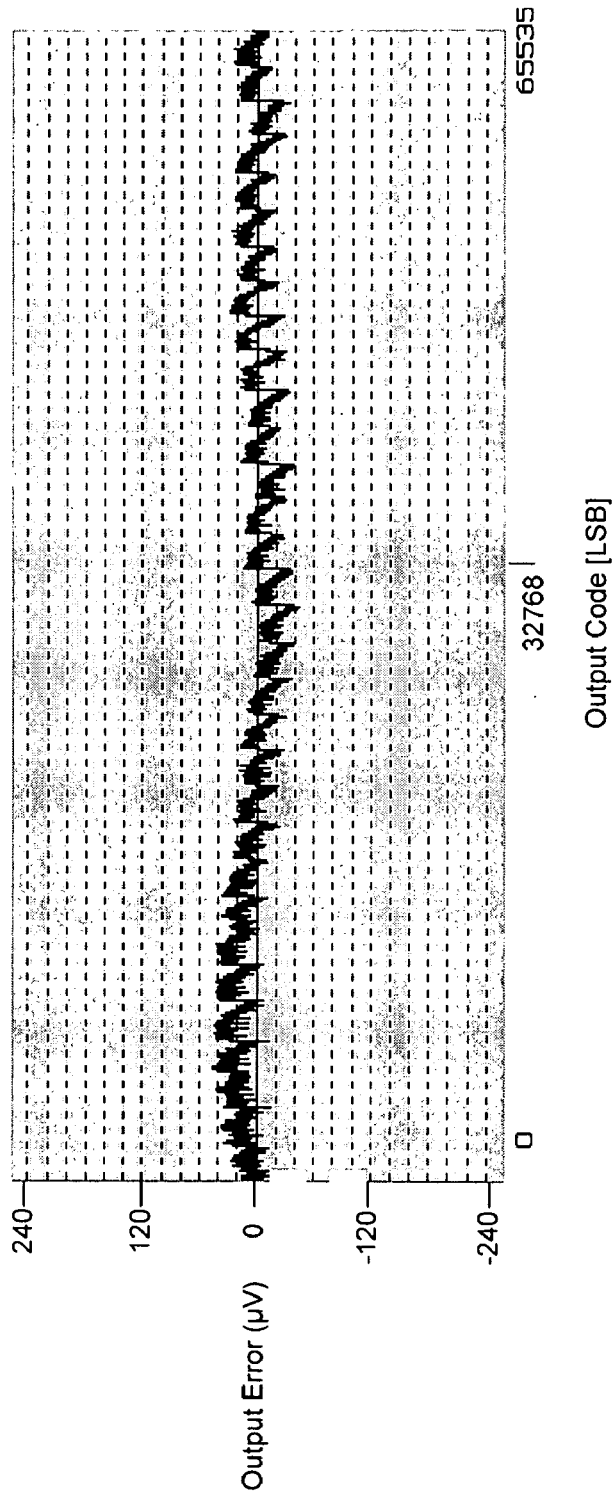
FIG. 4 is a graph illustrating the beneficial impact on the output of an ADC obtained from the circuit of FIG. 2, when subject to substantially the same conditions as in FIG. 1.

FIG. 4 is a graph exemplifying a beneficial impact obtained from using the circuit of FIG. 2. Specifically, FIG. 4 shows INL results obtained using the same method and system as that described above for FIG. 1, with the exception that reference driver circuit 200 from FIG. 2 was used to interface the ADC instead of the prior-art driver circuit used to obtain the results shown in FIG. 1.

Figure 5:
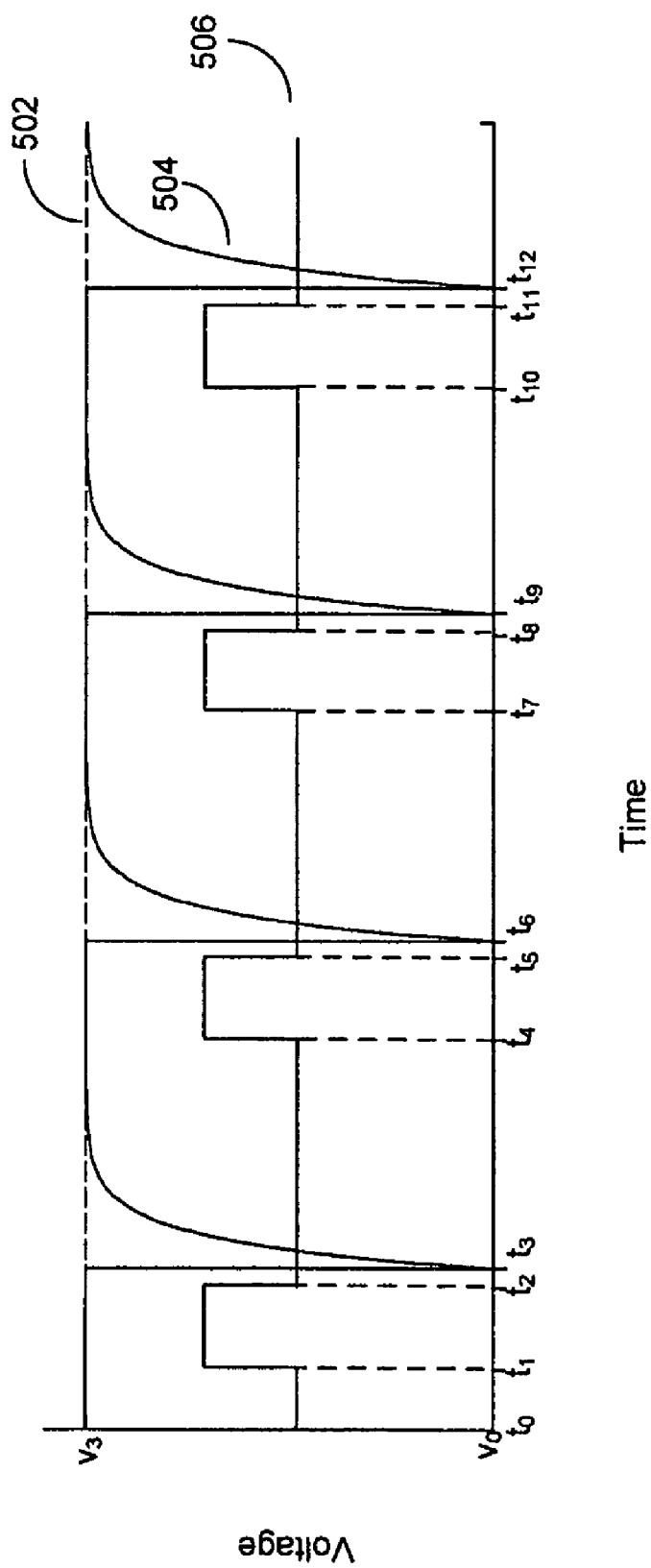
FIG. 5 is a timing diagram illustrating one mode of operation of the reference circuit of FIG. 2.

One possible mode of operation of circuit 200 is illustrated in the timing diagram 500 of FIG. 5. Diagram 500 illustrates the case where driver circuit 200 is coupled to a switched capacitor load 240 causing transient voltage spikes to occur at the output node 236 substantially periodically at times t3, t6, t9, t12, . . . . As shown, dashed line 502 represent's the nominal output voltage that would be observed on output node 236 when the load 240 is not switched and PMOS switch 206 is continuously ON. Line 504 represents the continuous voltage signal that may be observed on output node 236 when load 240 is being switched. The output voltage settles substantially to its nominal value after each spike, and it is thus substantially constant for a discrete-time application (such as a SAR ADC) that evaluates this signal only at predefined discrete points in time (e.g., at time instances t1, t4, t7, t10, . . . ).

As shown, line 506 is a representation of the logical state of PMOS switch 206. The switch is ON during time intervals t1 through t2, t4 through t5, t7 through t8, etc., and OFF during time intervals t2 through t4, t5 through t7, t8 through t10, etc. It will be understood that PMOS switch 206 can be turned ON by applying a low signal to its gate terminal, and likewise that it can be turned OFF by applying a high signal level to its gate terminal.

Accordingly, PMOS switch 206 may be turned OFF during the switching intervals when transient spikes may occur at the output node 236, thus preventing such spikes from disturbing the voltage regulation loop. PMOS switch 206 may be turned ON when $V_{REF}$ substantially attains its nominal value, thus ensuring that capacitor 212 will be charged to the proper voltage (provided by the voltage regulation loop) without substantially disturbing the voltage regulation loop.

In some embodiments of the invention, PMOS switch 206 may remain OFF for switching intervals during which multiple transient voltage spikes may occur at the output node 236. FIG. 5 shows an exemplary special case where only one transient occurs in each switching interval, and for which the operation is substantially periodic. It will be understood that reference driver circuit 200 may also be used advantageously for applications where the voltage spikes may be substantially aperiodic, and where the load circuit 240 may undergo several switching operations within a switching interval.

Some embodiments of the present invention may include detection circuitry such as frequency detection or spike anticipation circuitry to determine when it is advantageous to operate PMOS switch 206. Some embodiments may include circuitry implementing an adaptive algorithm controlling the timing source.

In other embodiments of the present invention, PMOS switch 206 may be operated in a predefined pattern, irrespective of whether or not the load circuit 240 can or will induce a substantial voltage spike on the output node 236.

Furthermore, in certain simplified circuits, PMOS transistor 206 and capacitor 212 may be removed, which results in a circuit configuration having a substantially direct connection between amplifier 202 and NMOS transistor 208 (not shown). With this implementation, voltage spikes at the switching interval may propagate through NMOS transistors 208, and 204, and feedback resistors 214 and 216 to the inverting terminal of amplifier 202, but such spikes are smaller in magnitude than those that may occur at output node 236. The magnitude of the voltage spikes at the inverting terminal of amplifier 202 may be reduced by increasing the value of capacitor 210 or by lowering the output impedance of the amplifier 202. In some embodiments, amplifier 202 may be a two-stage amplifier and the frequency compensation capacitor 210 may be incorporated into such two-stage amplifier.

Moreover, the simplified embodiment described above may be modified to include optional resistor 207 between the output of amplifier 202 and the gate of NMOS 208. Capacitor 212 may also be provided in this implementation. In such embodiments, an additional pole is introduced in the low pass transfer function from $V_{IN}$ to $V_{REF}$ which may help to attenuate any noise observed in $V_{REF}$.

It will be appreciated from the foregoing that the principles described above may be incorporated into numerous other circuit configurations to obtain the benefits further described herein. For example, the functional aspects of the reference circuit 200 may be incorporated or extended into other topologies, including, but not limited to, differential reference circuits or circuits having multiple grounding schemes, reference circuits with multiple outputs, low voltage applications, applications with limited headroom, applications with an improved power supply rejection ratio, drivers with modified voltage control loops, etc.

Figure 6:
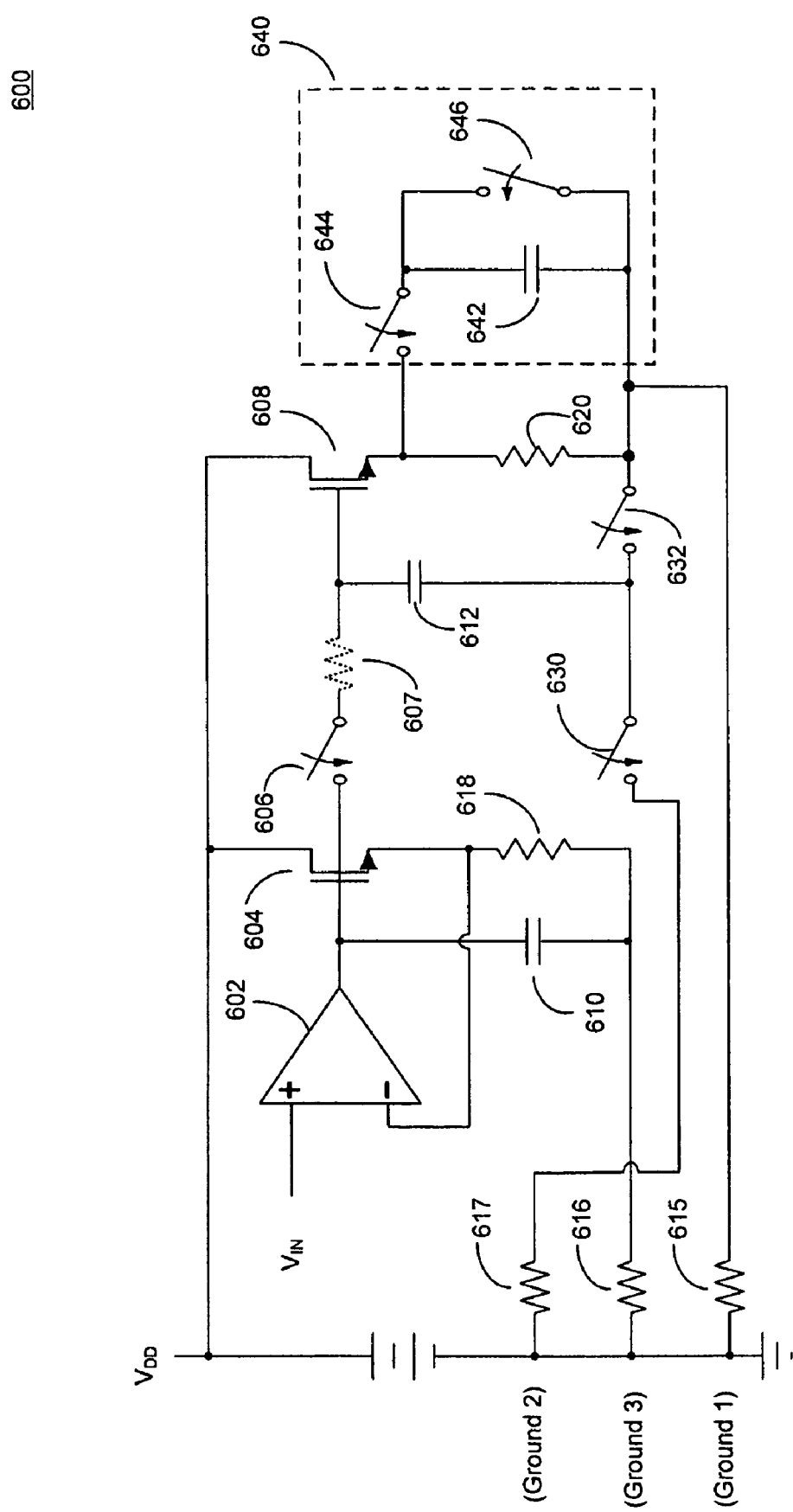
FIG. 6 is a schematic diagram of another embodiment of a voltage reference driver circuit constructed in accordance with the principles of the present invention.

An example of one such topology is the multiple grounding topology shown in FIG. 6. As shown, driver circuit 600 is similar in many respects to driver circuit 200 and generally includes components and functional blocks which have been numbered similarly to denote similar functionality and general correspondence. For example, reference driver circuit 600 generally includes an amplifier circuit 602, NMOS transistors 604 and 608, switching element 606, optional resistor 607, capacitors 610 and 612, and resistors 618 and 620 (amplifier circuit 202, NMOS transistors 204 and 208, switching element 206, optional resistor 207, capacitors 210 and 212, resistors 218 and 220 in FIG. 2).

Further, similar to FIG. 2, the circuit shown in FIG. 6 includes a generic switched-capacitor load circuit 640, which includes capacitor 642 and switches 644 and 646, which is not part of the reference driver circuit 600. Driver circuit 600 additionally includes switches 630 and 632 and connections to three different points within a conductive ground network. The unavoidable and finite parasitic impedances within the ground network are generally represented as resistors 615, 616, and 617. The three distinct points in the ground network may be electrically shorted to one another at one central location, which may be referred to as a "star-ground" connection. Such grounding schemes are commonly employed to prevent noisy, high frequency or large magnitude signals from sharing a common interconnected ground network with other more sensitive circuits and signals, which may be adversely affected by such a connection (i.e., to prevent ground-induced interference associated with return currents from other circuits flowing in and causing interfering voltage drops in a local ground network).

In operation, reference driver circuit 600 functions substantially similarly to reference driver circuit 200 described above, but further includes the capability to synchronously switch the bottom plate of capacitor 612 between multiple points in the ground network.

For example, a reference input voltage $V_{IN}$ is provided to the non-inverting terminal of amplifier 602 which establishes the voltage level provided by driver circuit 600. As mentioned above, this may be accomplished with a bandgap voltage reference or other known fixed voltage source (not shown). This fixed voltage source may be implemented such that its local ground network 617 is substantially separate from the other ground networks 615 and 616 (except for the common "star-ground" connection). The voltage regulation circuit (amplifier 602, NMOS 604, capacitor 610, and resistor 618) provides a voltage potential that tracks the voltage potential applied to the non-inverting input terminal of amplifier 602, both of which are substantially independent of voltage drops and transients that may exist in ground network 615.

As shown in FIG. 6, the output of amplifier 602 is further coupled to the gate of NMOS transistor 608 through switch 606 and optional resistor 607. During a regulation interval, the top plate of capacitor 612 charges to the voltage potential provided by amplifier 602. At the same time, the bottom plate of capacitor 612 is connected though switch 630 to the ground network 617 that is local to the fixed voltage source providing the input voltage $V_{IN}$. Switch 632 is open when switch 630 is closed, and vice versa. Accordingly, in a regulation interval, capacitor 612 is charged to the proper voltage differential substantially independent of any transients and static voltage drops that may exist in the ground network 615 local to the buffer circuit. The buffer circuit includes transistor 608 and resistor 620.

During a switching interval, switch 606 opens, disconnecting the voltage regulation circuit from capacitor 612 and the output. Likewise, during a switching interval, when switch 630 opens and switch 632 closes, and the bottom plate of capacitor 612 is connected to a node in ground network 615 that is in close proximity to, and has substantially the same potential as, a connecting terminal of the switched-capacitor load circuit 640. The buffer circuit will thereby provide a reference voltage across the connecting terminals of switched-capacitor load circuit 640, which is substantially independent of interfering voltage drops and transients in the ground networks 615, 616, 617.

Moreover, during switching intervals, relatively large current pulses may flow through NMOS 608 and in ground return path 615. Such current pulses may cause substantial transients within ground path 615. However, as described above, such transients will not substantially affect the reference voltage applied across the load circuit 640. Furthermore, because these current pulses do not flow in ground networks 617 and 616, which are local to the fixed voltage source and the voltage regulation circuit, they will not substantially interfere with or disturb the operation of these circuits.

For example, in operation, switches 606, 630, and 632 may be coupled to a control signal (not shown) that also controls the switching of load circuit 640 such that they operate in synchronous fashion. Switch 632 opens and closes in an inverse relationship with switches 606 and 630. In some embodiments, the switches in load circuit 640 may undergo one or more switching operations for each switching operation performed by switches 606, 630 and 632, potentially causing several transients to occur in each switching interval when switches 606 and 630 are open and switch 632 is closed.

Thus, the circuit of FIG. 6 describes a topology that selectively couples certain circuit portions among various available ground points to electrically separate the sensitive analog control loop from the output coupled to the switched capacitive load to minimize or substantially eliminate one cause of ground coupled interference from adversely affecting the analog control loop. Further, the buffer portion of circuit 600 is selectively referenced to substantially the same ground point as the load circuit 640 during a switching interval, which substantially cancels out the effects of another cause of ground coupled interference and thereby improves the regulation of the voltage provided to the load circuit 640.

Figure 7A:
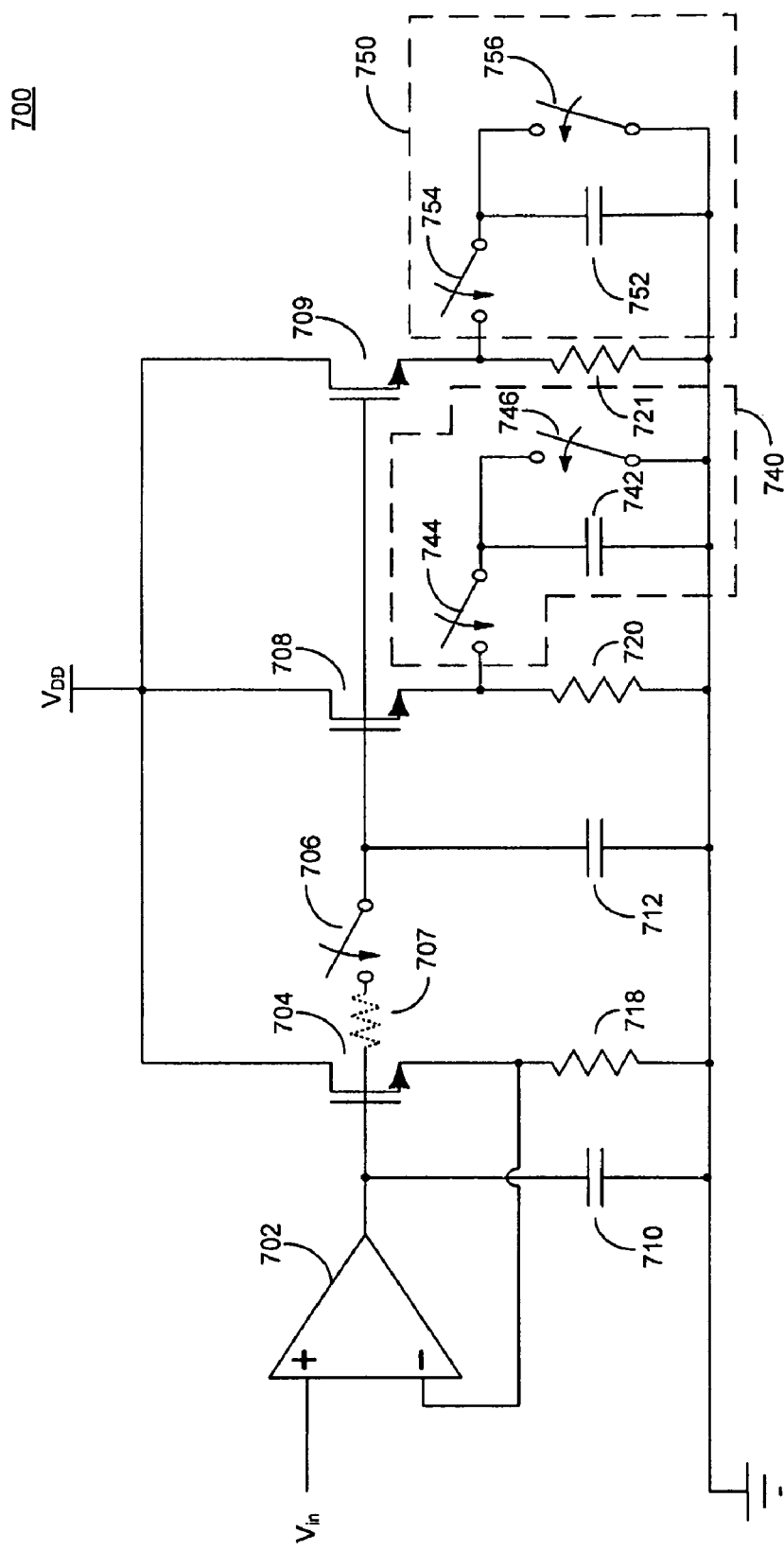
FIG. 7A is a schematic diagram of another embodiment of a voltage reference driver circuit constructed in accordance with the principles of the present invention.

An example of another driver circuit constructed in accordance with an aspect of the present invention is the dual output configuration illustrated in FIG. 7A. As shown, reference driver circuit 700 is configured to provide a reference voltage to two switched capacitor loads (loads 740 and 750). This configuration allows reference driver circuit 700 to provide a substantially constant voltage to two (or multiple) loads, and reduce the potential interference that switching of one load (e.g., 740) may cause on the voltage provided to the other load (e.g., 750).

One benefit of such a configuration is that a single reference circuit is capable of driving separate loads, each of which may have different load characteristics and different electrical functions, without having a direct connection, and without substantial electrical dependence between the two loads.

As shown, circuit 700 is similar in many respects to circuit 200 and generally includes components and functional blocks which have been numbered similarly to denote similar functionality and general correspondence. For example, reference circuit 700 generally includes an amplifier circuit 702, NMOS transistors 704 and 708, switching element 706, optional resistor 707, capacitors 710 and 712, and resistors 718 and 720 (amplifier circuit 202, NMOS transistors 204 and 208, switching element 206, optional resistor 207, capacitors 210 and 212, resistors 218 and 220 in FIG. 2).

Further, similar to FIG. 2, reference 700 includes a generic load circuit 740, which for purposes of illustration includes capacitor 742 and switches 744 and 746, which is not part of the reference driver circuit 700. Circuit 700 additionally includes a second generic load circuit 750, having capacitor 752 and switches 754 and 756, that is connected to reference 700 through the buffer formed by NMOS 709 and resistor 721. Load circuit 750 may be substantially independent of load circuit 740 and is also not part of the reference circuit 700.

It will be understood that load circuits 740 and 750 may also represent separate portions of a single composite load circuit. For example, load circuits 740 and 750 collectively may be a charge-scaling DAC embedded within a SAR ADC. In that configuration, load circuit 740 may be a part of the DAC that converts bits in a digital word having greater weights than the bits converted by load circuit 750 which may be another part of the DAC.

In operation, reference driver circuit 700 functions substantially similarly to reference driver 200 described above, but further provides an additional reference voltage output to load circuit 750.

Similar to the operation of driver circuits 200 and 600, the output of amplifier 702 is established by a reference input voltage $V_{IN}$ provided to the non-inverting terminal of amplifier 702, which establishes the voltage level provided by reference driver 700. As mentioned above, this may be accomplished with a bandgap voltage reference or other known fixed voltage source. The output voltage of amplifier 702 is controlled by the feedback network formed by NMOS transistor 704 and resistor 718.

As shown in FIG. 7A, the output of amplifier 702 is further coupled to the gates of NMOS transistors 708 and 709 through switch 706 and optional resistor 707. Capacitor 712 maintains the charge at the gate terminals of NMOS transistors 708 and 709 during the switching intervals when switch 706 is OFF, which determines the voltage provided to the load circuits 740 and 750. During the regulation intervals, switch 706 closes and charges capacitor 712 to the voltage provided by amplifier 702. More specifically, the output of amplifier 702 is coupled through switch 706 to the gate of transistor 708, which along with resistor 720 forms a buffer circuit which provides the buffered output reference voltage to load circuit 740.

Similarly, the output of amplifier 702 is coupled through switch 706 to the gate of transistor 709, which, along with resistor 721 forms a buffer circuit which provides the buffered output reference voltage to load circuit 750. During the regulation intervals, capacitor 712 charges to the voltage level provided by amplifier 702.

During a switching interval, switch 706 opens and disconnects amplifier 702 from the gates of transistors 708 and 709 to prevent voltage spikes from propagating back to the control loop from either switched capacitor load circuit 740 or 750. When this occurs, the bias signal on the gates of NMOS transistors 708 and 709 is maintained by the voltage on bias capacitor 712, which remains substantially constant. Moreover, a control node of switch 706 (not shown) may be coupled to a control signal that coordinates the switching of switched capacitor loads 740 and 750 such that the three operate in synchronous fashion.

Thus, just before a voltage spike occurs, switch 706 is opened, isolating NMOS transistors 708 and 709 from the rest of circuit 700, and preventing the ensuing voltage spike(s) and their effects from being transferred to and disturbing the control loop including amplifier 702. In some embodiments, additional propagation delay circuitry may be added to ensure proper switch timing (not shown).

In some embodiments, amplifier 702 may be designed to have a low output impedance (e.g., as a two-stage amplifier) and capacitor 710 may be included within amplifier 702 to ensure stability of the control loop. In addition, optional resistor 707 may be provided as an additional protection to attenuate any disturbance of the control loop that may occur prior to and/or shortly after the switching interval (e.g., due to unpredictable load conditions). Optional resistor 707 may also serve to reduce noise components contributed by amplifier 702, NMOS 704 and $V_{IN}$. If desired, optional resistor 707 may be split in two and provided on either or both sides of switch 706 (not shown). Moreover, in certain embodiments, the drain terminals of NMOS transistors 704, 708, and 709 may be coupled to different (or isolated) supply voltage sources $V_{DD}$ in order to further decouple the voltage control loop from the buffer circuits (not shown).

Specific embodiments of driver circuit 700 may be configured in numerous ways in view of certain specific applications or desired performance goals. For example, in one specific embodiment, NMOS transistors 708 and 709 and resistors 720 and 721 may be fabricated such they have the same or similar values. However, NMOS transistors 708 and 709 and resistors 720 and 721 need not be identical to one another, but may be designed to have substantially the same current densities. In this embodiment, load circuits 740 and 750 may switch synchronously with respect to switch 706 (although other switching schemes may be used if desired). In some embodiments, the control loop's feedback network (NMOS 704 and resistor 718) may be a scaled version of the two buffer circuits (NMOS 708 and resistor 720; NMOS 709 and resistor 721), which may themselves be scaled versions of one another.

Furthermore, it will be understood that although driver circuit 700 provides only two reference voltage outputs as illustrated, this circuit may be extended by adding additional buffer circuits to provide three or more reference voltage outputs, as desired.

Specific embodiments of reference circuit 700 may be advantageous for driving switched capacitor DACs in successive approximation A/D converters (and similar circuits). For example, a DAC may be implemented as a combination of two (or more) lower-resolution switched-capacitor DACs capacitively coupled to one another as is known in the art (not shown). An example of such a DAC may be a 14-bit DAC having an 8-bit MDAC (for the conversion of bits 1 through 8) combined with a 6-bit LDAC (for the conversion of bits 9 through 14). With this configuration, however, the LDAC may draw much more current than its weighting factors indicate due to the capacitive coupling of the LDAC to the MDAC (e.g., compare bits 9-14 in columns 3 and 4 of FIG. 7B, which illustrates the difference between the charge drawn by a true binary weighted DAC (column 3) and the charge drawn by the MDAC-LDAC combination described above (column 4)). The magnitude of a voltage spike that results from switching a load circuit is generally increasing with the amount of charge drawn by the load circuit.

Because of the relatively larger charge pulses drawn by the LDAC in column 4 of FIG. 7B, it may be desirable to have different reference buffers drive the MDAC and LDAC portions of the digital to analog converter (i.e., to decouple the LDAC from the MDAC to prevent spikes induced by switching the LDAC from coupling to the DAC's analog output through the reference voltage driving the MDAC). Accordingly, in the circuit of FIG. 7A, load circuit 740 may represent the MDAC, and load circuit 750 may represent the LDAC. This arrangement separates the buffer driving the LDAC from the buffer driving the MDAC. Thus, when the LDAC is switched (bits 9 through 14) it will cause a spike on its own reference buffer (NMOS 709 and resistor 721), and a substantially smaller spike on the buffer driving the MDAC (NMOS 708 and resistor 720). The relative magnitudes of the two spikes depend on a number of factors, including the size of capacitor 712. The larger the capacitor, the greater the degree of suppression from one buffer to the other, and vice versa. Suppression can be further improved by including a switch (not shown) between the gate terminals of NMOS transistors 708 and 709 operating synchronously with switch 706. In some embodiments, it may be further advantageous to have separate ground return paths for load circuits 740 and 750 (not shown).

Figure 8:
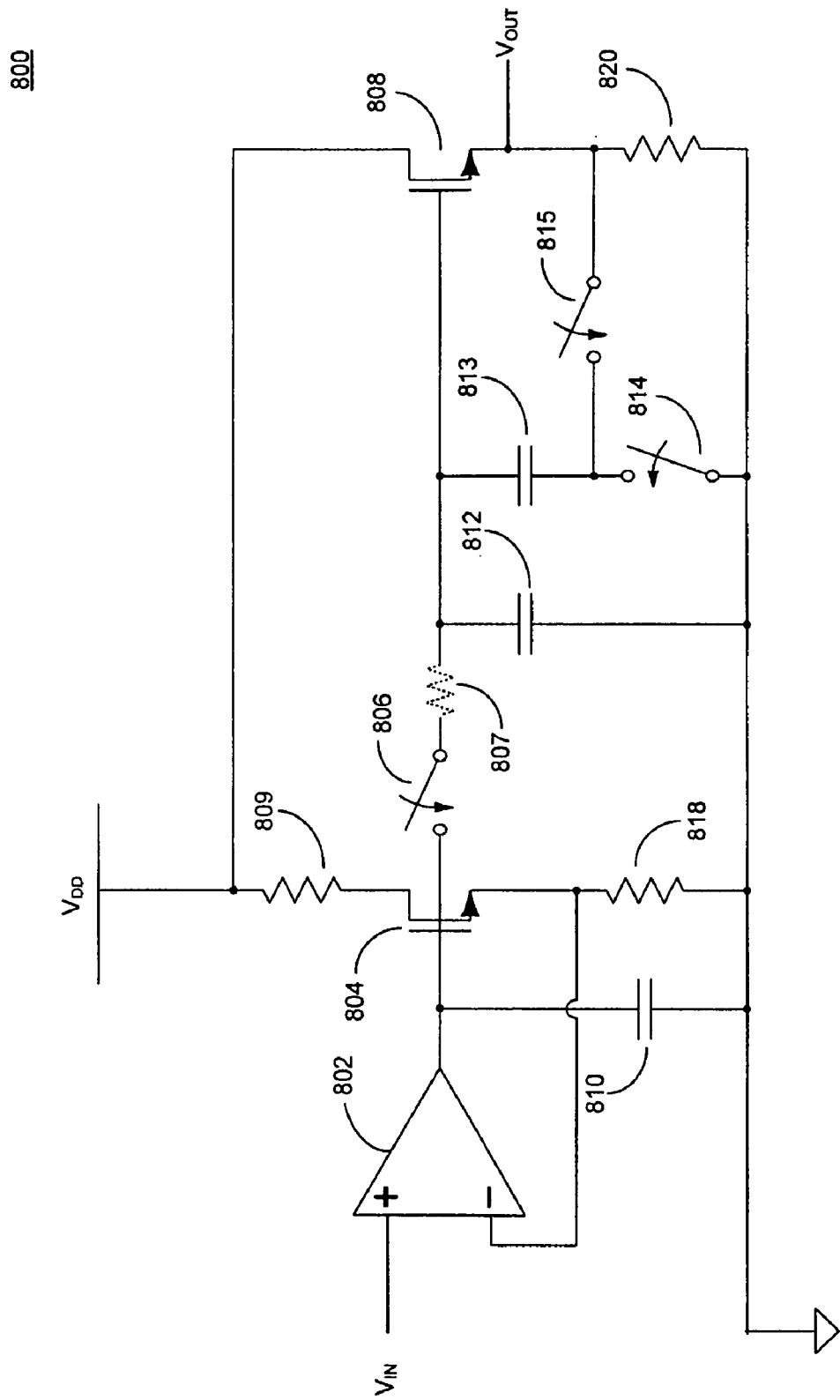
FIG. 8 is a schematic diagram of another embodiment of a voltage reference driver circuit constructed in accordance with the principles of the present invention.

An example of another driver circuit embodiment constructed in accordance with an aspect of the present invention is the "limited headroom" topology illustrated in FIG. 8. This embodiment is useful in circuit implementations where the desired output reference voltage is only slightly lower than the supply voltage $V_{DD}$ provided to the circuit. This constraint may occur in applications that are required to operate with a low supply voltage. Furthermore, in some applications, it may be preferred to use a large reference voltage (e.g., to achieve a desired high signal-to-noise ratio) limited primarily by the available supply voltage $V_{DD}$. The amount by which the supply voltage exceeds the reference voltage may be referred to as the "headroom". FIG. 8 illustrates how a driver circuit 800 can be implemented in accordance with an aspect of the present invention when the headroom is limited.

As shown, circuit 800 is similar in many respects to circuit 200 and generally includes components and functional blocks which have been numbered similarly to denote similar functionality and general correspondence. For example, reference circuit 800 generally includes an amplifier circuit 802, NMOS transistors 804 and 808, switching element 806, optional resistor 807, capacitors 810 and 812, and resistors 818 and 820 (amplifier circuit 202, NMOS transistors 204 and 208, switching element 206, optional resistor 207, capacitors 210 and 212, resistors 218 and 220 in FIG. 2).

Furthermore, circuit 800 includes resistor 809, capacitor 813, and switches 814 and 815 which may be used to boost the bias voltage provided to the gate of transistor 808 (from amplifier 802). Thus, in operation, switch 806, capacitors 812-813 and switches 814-815 form a voltage booster isolation circuit that provides a boosted bias voltage to the gate of transistor 808. Moreover, although not shown, a switched capacitor load circuit similar to the ones described herein may be coupled to $V_{OUT}$.

In operation, the output of amplifier 802 is established by an input voltage $V_{IN}$ provided to the non-inverting terminal of amplifier 802. This sets the voltage produced at the output of reference 800. However, in circuit 800, the input voltage may be a predefined fraction of the desired reference voltage $V_{OUT}$ at the output during the switching intervals. This predefined ratio is the reciprocal value of the voltage increase "boosting factor" of circuit 800.

The output voltage $V_{OUT}$ may be substantially the same as the applied input voltage $V_{IN}$ during the regulation intervals when the switch 806 is closed. However, during the switching intervals, when switch 806 is open, the output voltage $V_{OUT}$ will be substantially the same as the input voltage $V_{IN}$ multiplied by the boosting factor. In some embodiments, the voltage that appears on the gate terminal of NMOS 808 during a switching interval may exceed the supply voltage $V_{DD}$.

One way this may be accomplished is by splitting the resistor coupled to NMOS 804 into two resistors (818 and 809) and splitting the capacitor coupled to NMOS 808 into two capacitors (as compared to circuit 200 in FIG. 2) and adding switches 814 and 815. The overall value of these components may be same as or similar to components 218 and 212 but distributed among them based on the desired boosting factor.

For example, the ratio of the total capacitance of capacitors 812 and 813 relative to that of capacitor 812 alone may be the same as the boosting factor. Likewise, the ratio of the total resistance of resistors 809 and 818 relative to that of resistor 818 alone may be the same as the boosting factor. Further, in some embodiments, it may be advantageous to implement NMOS 804 and 808 in independent and separate P-wells that are connected to the respective devices' source terminals.

Thus, during one phase of operation, such as a regulation interval, switches 806 and 814 are closed and switch 815 is open. In this case, the output voltage potential of amplifier 802 is stored on capacitors 812 and 813. Next, before or during a switching interval, switches 806 and 814 open, and switch 815 closes, causing the output voltage $V_{OUT}$ of circuit 800 to be substantially equal to the applied input voltage $V_{IN}$ multiplied by the predefined boosting factor.

In some embodiments, however, it may be advantageous to operate the circuit 800 as a three phase system. In such a system, during a first phase, switches 806 and 814 are closed and switch 815 is open. During the first phase, the output voltage $V_{OUT}$ may be less than the output voltage provided during a switching interval (the third phase). In the second phase, switches 806 and 814 are open and switch 815 is closed. The load circuit is not switched during this phase, and may be disconnected from the driver circuit 800. In the second phase, the output voltage $V_{OUT}$ may settle to a voltage that is substantially the same as the input voltage $V_{IN}$ multiplied by the predefined boosting factor. In the third phase, switches 806 and 814 are open and switch 815 is open as well. The load circuit may be connected to $V_{OUT}$ and switched one or more times during the third phase (causing one or more transients in $V_{OUT}$) before the process repeats starting again from the first phase.

Furthermore, in some embodiments of the invention, a charge-pump circuit (not shown) may be used, if desired, to generate a supply voltage exceeding $V_{DD}$ to supply amplifier 802, such that it can generate an output voltage exceeding $V_{DD}$ as may be required to drive NMOS 808 when the headroom is small. In such embodiments, capacitor 813, switches 815 and 814 and resistor 809 may be removed (i.e., an embodiment similar to circuit 200 may be used, if desired).

Figure 9:
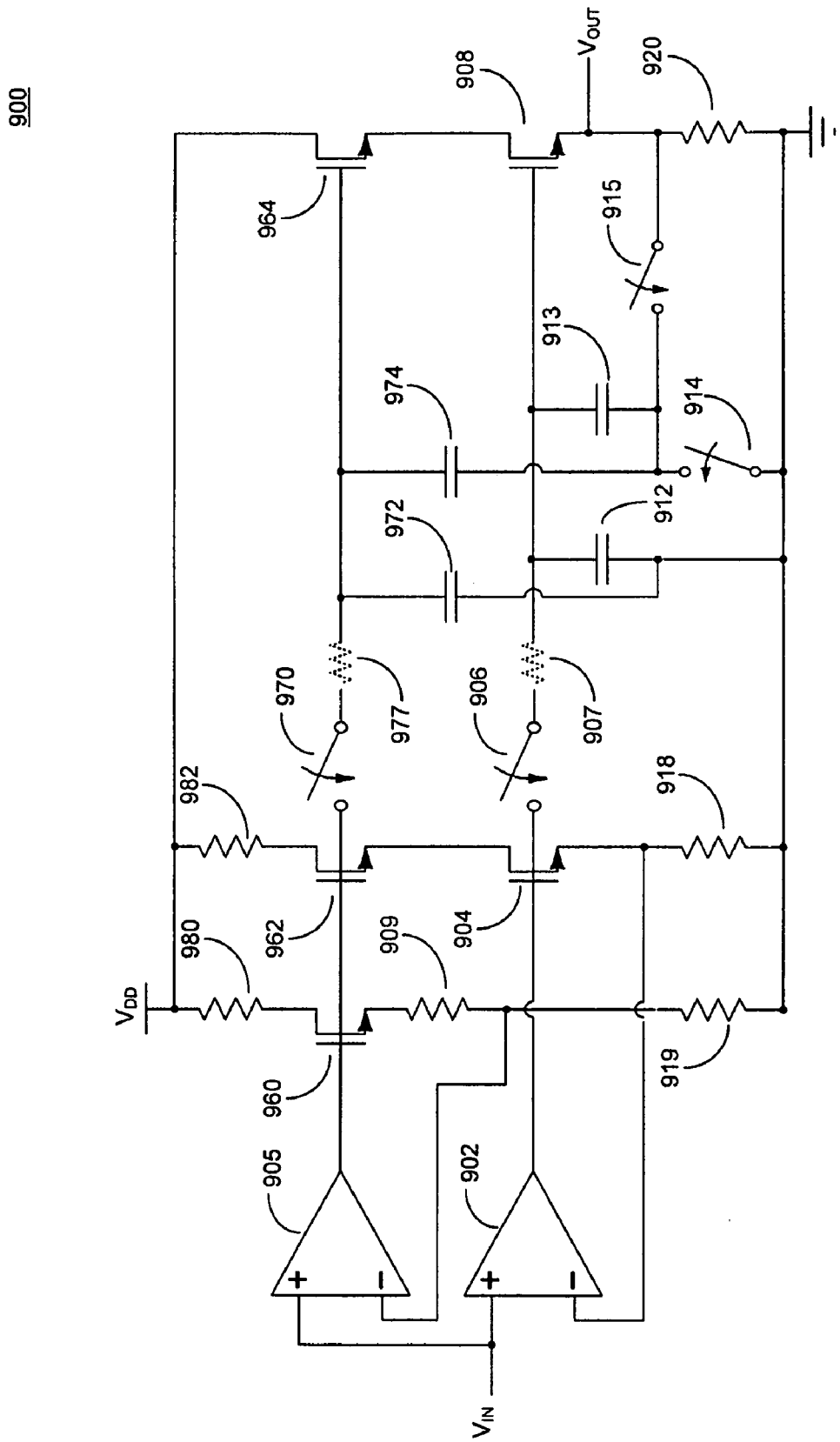
FIG. 9 is a schematic diagram of yet another embodiment of a voltage reference driver circuit constructed in accordance with the principles of the present invention.

An example of another circuit embodiment constructed in accordance with an aspect of the present invention is the limited headroom topology illustrated in FIG. 9. This embodiment is useful to improve the power supply rejection ratio of the reference driver circuit 800 shown in FIG. 8. Generally speaking, this is due to the regulation of the voltages that are applied to the drain terminals of NMOS transistors 904 and 908 shown in FIG. 9. Using this configuration, fluctuation of the supply voltage $V_{DD}$ may cause little or no variation in the voltages that are applied to the drain terminals of NMOS transistors 904 and 908. This may further limit or suppress any coupling of a voltage spike from the output buffer circuit through the supply voltage rail $V_{DD}$ to the voltage control loop.

As shown, driver circuit 900 is similar in many respects to circuit 800 and generally includes components and functional blocks which have been numbered similarly to denote similar functionality and general correspondence. For example, reference circuit 900 generally includes an amplifier circuit 902, NMOS transistors 904 and 908, switches 906, 914 and 915, optional resistor 907, capacitors 912 and 913, and resistors 918 and 920 (amplifier circuit 802, NMOS transistors 804 and 808, switches 806, 814 and 815, optional resistor 807, capacitors 812 and 813, and resistors 818 and 820 in FIG. 8). The frequency compensation of amplifier 902 (capacitor 810 in FIG. 8) is not shown explicitly in FIG. 9.

Furthermore, circuit 900 includes amplifier circuit 905, NMOS transistors 960, 962 and 964, switch 970, optional resistor 977, capacitors 972 and 974, and resistors 909, 919, 980 and 982. Moreover, although not shown, a switched capacitor load circuit similar to the ones described herein may be coupled to the driver circuit's output $V_{OUT}$.

In operation, amplifier circuit 905 provides a voltage potential, which ensures that the voltage across the drain and source terminals of NMOS transistor 904 is substantially constant. NMOS transistors 960 and 962 and resistors 980 and 982 may be substantially the same, or they may be scaled to have a predefined ratio. Similarly, resistors 919 and 918 may also be substantially the same, or be scaled in the same predefined ratio.

The negative feedback loops implemented in circuit 900 ensure that the voltage potentials at the inverting input terminals of amplifiers 902 and 905 will be substantially the same as the fixed input voltage $V_{IN}$. Accordingly, the voltages across resistors 918 and 919 will be substantially the same, and thus NMOS transistors 960 and 962 will conduct substantially the same current (or the currents will be scaled in the predefined ratio). Consequently, the voltage potentials at the source terminals of transistors 960 and 962 will be substantially the same.

Furthermore, as discussed above, the voltage potentials at the inverting input terminals of amplifiers 902 and 905 will be substantially the same. As a result, if circuit 900 is scaled properly, the voltage across resistor 909 will be substantially the same as the drain-to-source voltage across NMOS transistor 904. Accordingly, the voltage across NMOS transistor 904 may be selected by scaling resistor 909 with respect to resistor 919, and it may be substantially independent of the supply voltage $V_{DD}$.

Current pulses drawn from the supply voltage rail $V_{DD}$ by switching the load circuit (not shown explicitly) may cause transients on the supply voltage rail $V_{DD}$. The implication of such transients on $V_{DD}$ may be suppressed by amplifier 905, improving the circuit's overall voltage regulation of $V_{OUT}$ (as compared to other single-amplifier implementations).

In operation, switch 970 may be operated synchronously with switch 906. During regulation intervals, switches 970, 906, and 914 may be closed and switch 915 may be open. At this point, the voltage potential stored on capacitors 972 and 974 connected to the gate terminal of NMOS 964 is substantially the same as the voltage potential provided by amplifier 905. Likewise, and similar to the operation of driver circuit 800 discussed above, the voltage potential stored on capacitors 912 and 913 connected to the gate terminal of NMOS 908 is substantially the same as the voltage potential provided by amplifier 902. Accordingly, during a regulation interval, the drain-to-source voltage across NMOS 908 may be substantially the same as the drain-to-source voltage across NMOS 904, and the voltages may be selected, in part, by scaling resistor 909 as described above.

Further, during a switching interval, switches 970, 906, and 914 may be open, and switch 915 may be closed. Opening switches 906 and 970 substantially isolates the charge stored on the nodes connected to the gate terminals of NMOS 964 and 908. Toggling switches 914 and 915 substantially simultaneously with (or shortly after) opening switches 970 and 906, boosts the voltage potentials at the gate terminals of NMOS transistors 908 and 964. Thus, similar to the operation of driver circuit 800 described above, the output voltage $V_{OUT}$ may be substantially the same as the input voltage $V_{IN}$ multiplied by a predefined boosting factor. As described herein with respect to driver circuit 800, the boosting factor may be selected, at least in part, by choosing the ratio of capacitors 913 and 912. Capacitors 974 and 972 may be selected to have substantially the same ratio as capacitors 913 and 912. The driver circuit 900, and capacitors 912, 913, 972 and 974 in particular, may be scaled such that the drain-to-source voltage across NMOS 908 in a switching interval is substantially the same as the drain-to-source voltage of NMOS 904.

During switching intervals, NMOS transistor 964 may ensure that the voltage on the drain terminal of NMOS 908 has reduced dependence of, or is substantially independent of, the exact voltage on the supply voltage rail $V_{DD}$. This may be advantageous, because other circuits (not shown in FIG. 9) may cause spikes on the supply voltage rail $V_{DD}$, that would otherwise interfere with the output reference voltage $V_{OUT}$. Accordingly, the driver circuit 900 shown in FIG. 9 provides an improved power supply rejection ratio, and may provide superior performance for applications where the power supply rail is expected to experience spikes.

It will be understood that driver circuit 900 may be operated as a three phase system similar to circuit 800 as described above. Resistors 907 and 977 are both optional, and in some embodiments one or both of these resistors may be included. Also, in some embodiments, when both resistors 907 and 977 are included, they may be scaled such that resistor 907 is substantially larger than resistor 977.

Although preferred embodiments of the present invention have been disclosed with various circuits connected to other circuits, persons skilled in the art will appreciate that it may not be necessary for such connections to be direct and that additional circuits may be interconnected between the shown connected circuits without departing from the spirit of the invention as shown. Moreover, although the invention has been illustrated herein in the context of analog to digital and digital to analog converters, it will be understood that it is applicable to any circuit or application requiring a regulated voltage be provided to a load which experiences bias modulation (e.g., any reactive load, resistive load etc.). Furthermore, although the invention has been illustrated using either specific or generic switches in certain sections, it will be understood that any appropriate implementation of such switches may be used, including (but not limited to) implementations based on bipolar junction, field effect, insulated-gate and any other type of transistor, semiconductor device or non-semiconductor type switches.

In addition, it will be understood that the various embodiments illustrated herein depict complementary technologies and may be incorporated into one another as desired by a circuit designer to obtain the described benefits. For example, the circuit shown in FIG. 6 may be combined with the circuits shown in FIGS. 7A and 9, etc. Likewise, and only as another example, regulating the drain voltages using an auxiliary control loop as described for circuit 900 may be combined with other embodiments described herein, and it may also be advantageously combined with many other embodiments incorporating aspects of this invention. A person of ordinary skill in the art will appreciate that many variations and combinations of the described embodiments are contemplated to obtain benefits described and exemplified herein.

Further, it will be understood that NMOS 204, 604, 704, 804, and 904 (referring to FIGS. 2, 6, 7, 8 and 9, respectively) in combination with resistors 218, 618, 718, 818, and 918 (referring to FIGS. 2, 6, 7, 8 and 9, respectively) and amplifiers 202, 602, 702, 802, and 902 (referring to FIGS. 2, 6, 7, 8 and 9, respectively) is merely one exemplary way to implement a control system that provides a voltage that may be used to bias the gate terminal of the output device 208, 608, 708, 808, and 908 (referring to FIGS. 2, 6, 7, 8 and 9, respectively) during a regulation interval. It will be understood by persons skilled in the art that the replica voltage potential (i.e., the voltage potential on the source terminal of NMOS 204, 604, 704, 804, and 904 referring to FIGS. 2, 6, 7, 8 and 9, respectively) need not be generated within the control system.

In some embodiments incorporating the spirit of this invention, for example, the control system may incorporate a circuit branch with a series switch connected to the output of the buffer circuit (i.e., to the source terminal of NMOS 208, 608, 708, 808, and 908 referring to FIGS. 2, 6, 7, 8 and 9, respectively), where the switch may be open during a switching interval to prevent or attenuate the extent to which voltage spikes at the output may interfere with the control system. In such embodiments of this invention, the control system may incorporate circuitry substantially configured and operating, at least in part, as an integrator circuit.

Further still, although the embodiments herein have been described in the context of voltage signals, it will be understood that it is contemplated that in other embodiments these voltage signals may be replaced with current signals, charge signals, or other electrical energy signals (with the appropriate energy storage devices) without departing from the spirit and scope of the present invention.

Persons skilled in the art also will appreciate that the present invention can be practiced by other than the specifically described embodiments. The described embodiments are presented for purposes of illustration and not of limitation, and the present invention is limited only by the claims which follow.

What is claimed is:

1. An electronic circuit configured to provide a substantially constant output voltage to a load, comprising:
   a voltage regulation circuit that generates a substantially constant voltage the voltage regulation circuit comprising a first transistor device;
   a buffer circuit coupled to the voltage regulation circuit, the buffer circuit comprising a second transistor device, the buffer circuit providing the substantially constant output voltage to the load based on the substantially constant voltage generated by the voltage regulation circuit; and
   an isolation circuit coupled to the voltage regulation circuit and the buffer circuit for selectively disconnecting the buffer circuit from the voltage regulation circuit at or before the occurrence of a pulse induced by the load,
   wherein the first transistor device and the second transistor device operate with substantially the same current density.

2. The electronic circuit of claim 1 wherein the load is a switched capacitor load.

3. The electronic circuit of claim 2 wherein the switched capacitor load is part of an analog to digital converter.

4. The electronic circuit of claim 3 wherein the isolation circuit operates with respect to a control signal that controls the analog to digital converter.

5. The electronic circuit of claim 1 wherein the first transistor device and the second transistor device are N-type MOSFET transistors.

6. The electronic circuit of claim 2 wherein the isolation circuit operates synchronously with respect to the switched capacitor load.

7. The electronic circuit of claim 6 wherein the isolation circuit comprises a switching element.

8. The electronic circuit of claim 2 further comprising a charge storage component coupled to a gate terminal of the second transistor device, wherein the charge storage component maintains a substantially constant charge on the gate terminal when the isolation circuit disconnects the buffer circuit from the voltage regulation circuit.

9. The electronic circuit of claim 2 wherein at least part of the voltage regulation circuit is powered by a charge pump circuit.

10. An analog to digital conversion circuit having improved accuracy when converting an input signal from the analog domain to the digital domain; the analog to digital conversion circuit comprising:
    a digital to analog converter circuit having a plurality of switched capacitors;
    a voltage reference driver circuit coupled to the digital to analog converter circuit configured to provide a substantially constant output voltage to the plurality of switched capacitors, the voltage reference driver circuit comprising:
    a voltage regulation circuit that generates a substantially constant voltage, the voltage regulation circuit comprising a first transistor device operating at a first current density;
    a buffer circuit coupled to the voltage regulation circuit, the buffer circuit comprising a second transistor device operating at a second current density which is substantially the same as the first current density, the buffer circuit providing the substantially constant output voltage to the plurality of switched capacitors based on the substantially constant voltage generated by the voltage regulation circuit;
    an isolation circuit coupled to the voltage regulation circuit and the buffer circuit for selectively disconnecting the buffer circuit from the voltage regulation circuit at or before the occurrence of a pulse induced by switching the plurality of switched capacitors;

wherein selectively disconnecting the buffer circuit substantially reduces or prevents the pulse from propagating back to the voltage regulation circuit, reducing drift of the substantially constant output voltage and thereby improving accuracy of the analog to digital converter.

11. The analog to digital conversion circuit of claim 10 wherein the isolation circuit is controlled by a control signal that controls the analog to digital converter.

12. An electronic circuit configured to provide a substantially constant output voltage to a load, comprising:

a plurality of connections that allow portions of the electronic circuit to be selectively connected to at least one of a plurality of ground paths, the load being connected to a first ground path;

a voltage regulation circuit that generates a substantially constant voltage with respect to a second ground path;

a buffer circuit having a control node coupled to the voltage regulation circuit, the buffer circuit providing the substantially constant output voltage to the load based on the substantially constant voltage generated by the voltage regulation circuit;

a charge storage element coupled between the control node and the first ground path during a switching interval; and an isolation circuit coupled to the voltage regulation circuit and the buffer circuit for selectively disconnecting the control node from the voltage regulation circuit at or before the occurrence of a pulse induced by the load during the switching interval such that the substantially constant output voltage provided to the load is substantially unaffected by voltage variation within the first ground path.

13. The electronic circuit of claim 12 wherein the voltage regulation circuit comprises a first N-type semiconductor having a gate terminal biased at the substantially constant voltage generated by the voltage regulation circuit and a source terminal biased at a voltage having a predefined relationship with the substantially constant output voltage.

14. The electronic circuit of claim 13 wherein the buffer circuit comprises a second N-type semiconductor having a gate terminal connected to the control node and a source terminal connected to the load.

15. The electronic circuit of claim 12 wherein the charge storage element is coupled to the second ground path during a regulation interval such that the charge storage element is charged to a control voltage that is substantially independent of current flowing in the first ground path.

16. The electronic circuit of claim 12 wherein the load is a switched capacitor load.

17. The electronic circuit of claim 16 wherein the switched capacitor load is part of an analog to digital converter.

18. The circuit of claim 15 wherein the charge storage element is coupled to the first ground path and disconnected from the second ground path substantially synchronously with the isolation circuit disconnecting the control node of the buffer circuit from the voltage regulation circuit.

19. The circuit of claim 18 wherein the charge storage element is coupled to the second ground path and disconnected from the first ground path substantially synchronously with the isolation circuit connecting the control node of the buffer circuit to the voltage regulation circuit.

20. The circuit of claim 18 wherein the isolation circuit operates with respect to a control signal that controls an analog to digital converter.

21. The circuit of claim 15 wherein the first and second ground paths are connected in a star-ground connection.

22. The electronic circuit of claim 14 wherein a voltage between the gate and source terminals of the second N-type semiconductor during the switching interval is substantially the same as a voltage between the gate and source terminals of the first N-type semiconductor.

23. An analog to digital conversion circuit having improved accuracy when sampling and converting an input signal from the analog domain to the digital domain;

the analog to digital conversion circuit comprising:

a digital to analog converter circuit having a plurality of switched capacitors;

a voltage reference circuit coupled to the digital to analog converter circuit configured to provide a substantially constant output voltage to the plurality of switched capacitors, the voltage reference circuit comprising:

a plurality of connections that allow portions of the voltage reference circuit to be selectively connected to at least one of a plurality of ground paths;

a voltage regulation circuit that generates a substantially constant voltage;

a buffer circuit coupled to the voltage regulation circuit, the buffer circuit providing the substantially constant output voltage to the plurality of switched capacitors based on the substantially constant voltage generated by the voltage regulation circuit;

an isolation circuit coupled to the voltage regulation circuit and the buffer circuit for selectively disconnecting the buffer circuit from the voltage regulation circuit at or before the occurrence of a pulse induced by switching the plurality of switched capacitors;

wherein a charge storage element, the buffer circuit and the plurality of switched capacitors are coupled to a first ground path during a switching interval such that the substantially constant output voltage remains substantially unaffected by voltage drops within the first ground path during the switching interval.

24. The analog to digital conversion circuit of claim 23 wherein the isolation circuit and coupling the charge storage element to the first ground path is controlled by a control signal that controls the analog to digital converter.

25. The analog to digital conversion circuit of claim 23 wherein the charge storage element is coupled to the first ground path from a second ground path substantially synchronously with the isolation circuit disconnecting the buffer circuit from the voltage regulation circuit.

26. The analog to digital conversion circuit of claim 23 wherein the charge storage element is coupled to a second ground path from the first ground path substantially synchronously with the isolation circuit connecting the buffer circuit to the voltage regulation circuit.

27. The analog to digital conversion circuit of claim 26 wherein the substantially constant voltage generated by the regulation circuit is substantially constant with respect to a reference point in the second ground path.

28. The analog to digital conversion circuit of claim 26 wherein the first and second ground paths are connected in a star-ground connection.

29. An electronic circuit configured to provide a substantially constant output voltage to a plurality of loads, comprising:

a voltage regulation circuit that generates a substantially constant voltage;

a first buffer circuit coupled to the voltage regulation circuit, the first buffer circuit providing the substantially constant output voltage to a first load based on the substantially constant voltage generated by the voltage regulation circuit;

a second buffer circuit coupled to the voltage regulation circuit, the second buffer circuit providing the substantially constant output voltage to a second load based on the substantially constant voltage generated by the voltage regulation circuit; and an isolation circuit coupled to the voltage regulation circuit and to the first and second buffer circuits for selectively disconnecting the first and second buffer circuits from the voltage regulation circuit at or before the occurrence of a pulse induced by the plurality of loads during a switching interval.

30. The electronic circuit of claim 29 wherein the first and second loads are switched capacitor loads.

31. The electronic circuit of claim 30 wherein the first and second switched capacitor loads are part of an analog to digital converter.

32. The electronic circuit of claim 31 wherein the analog, to digital converter is a successive approximation analog to digital converter and wherein the first switched capacitor load is an MDAC and the second switched capacitor load is an LDAC.

33. The electronic circuit of claim 30 further comprising a third buffer circuit and a third switched capacitor load.

34. The electronic circuit of claim 31 wherein the isolation circuit operates with respect to a control signal that controls the analog to digital converter.

35. The electronic circuit of claim 30 wherein the isolation circuit operates synchronously with respect to the first and second switched capacitor loads.

36. The electronic circuit of claim 29 wherein the first load is a part of a first analog to digital converter circuit processing a first analog input signal and the second load is a part of a second analog to digital converter circuit processing a second analog input signal, and wherein the first analog input signal is substantially independent of the second analog input signal.

37. An analog to digital conversion circuit having improved accuracy when sampling an input signal from the analog domain to the digital domain; the analog to digital conversion circuit comprising:

a digital to analog converter circuit having a plurality of switched capacitors including an MDAC and an LDAC;

a voltage reference driver circuit coupled to the digital to analog converter circuit configured to provide a substantially constant output voltage to the plurality of switched capacitors, the voltage reference driver circuit comprising:

a voltage regulation circuit that generates a substantially constant voltage;

a first buffer circuit coupled to the voltage regulation circuit, the first buffer circuit providing the substantially constant output voltage to the MDAC based on the substantially constant voltage generated by the voltage regulation circuit;

a second buffer circuit coupled to the voltage regulation circuit, the second buffer circuit providing the substantially constant output voltage to the LDAC based on the substantially constant voltage generated by the voltage regulation circuit; and an isolation circuit coupled to the voltage regulation circuit and the first and second buffer circuits for selectively disconnecting the first and second buffer circuits from the voltage regulation circuit at or before the occurrence of a pulse induced by the plurality of switched capacitors;

wherein selectively disconnecting the first and second buffer circuits substantially reduces or prevents the pulse from propagating back to the voltage regulation circuit.

38. The analog to digital conversion circuit of claim 37 wherein the isolation circuit operates synchronously with respect to the MDAC and LDAC.

39. An electronic circuit receiving a substantially constant input voltage and configured to provide a substantially constant output voltage to a load, the electronic circuit comprising:

a voltage regulation circuit that generates a substantially constant bias voltage based on the substantially constant input voltage;

a buffer circuit providing the substantially constant output voltage based on a substantially constant boosted bias voltage; and a voltage booster isolation circuit coupled to the voltage regulation circuit and the buffer circuit, the voltage booster isolation circuit selectively disconnecting the buffer circuit from the voltage regulation circuit at or before the occurrence of a pulse induced by the load, the voltage booster isolation circuit being configured to provide the boosted bias voltage to the buffer circuit during a switching interval.

40. The electronic circuit of claim 39 wherein the load is a switched capacitor load.

41. The electronic circuit of claim 40 wherein the switched capacitor load is part of an analog to digital converter.

42. The electronic circuit of claim 41 wherein the voltage booster isolation circuit comprises a first charge storage device having a first terminal with an increased voltage potential when the voltage booster isolation circuit disconnects the voltage regulation circuit from the buffer circuit.

43. The electronic circuit of claim 42 wherein the voltage booster isolation circuit operates with respect to a control signal that is derived from a timing signal that controls the analog to digital converter.

44. The electronic circuit of claim 40 wherein the voltage booster isolation circuit operates synchronously with respect to the switched capacitor load.

45. The electronic circuit of claim 44 wherein the voltage booster isolation circuit comprises:

a first charge storage device having a first terminal with an increased voltage potential when the voltage booster isolation circuit disconnects the voltage regulation circuit from the buffer circuit, and a second charge storage device having a terminal connected to a second terminal of the first charge storage device.

46. The electronic circuit of claim 44 wherein the boosted bias voltage exceeds a supply voltage.

47. The electronic circuit of claim 39 wherein the voltage regulation circuit comprises a first transconductance element and a first resistor and a second resistor, and wherein the buffer circuit comprises a second transconductance element and a third resistor, and wherein the first, second and third resistors are proportioned such that the first and second transconductance elements have substantially the same current densities and terminal to terminal voltages during a switching interval.

48. The circuit of claim 44 wherein the voltage booster isolation circuit comprises a plurality of capacitors having a common node connected to an input node of the buffer circuit during the switching interval, and wherein the common node of the plurality of capacitors is charged to the substantially constant bias voltage generated by the voltage regulation circuit during a regulation interval.

49. The circuit of claim 39 further comprising circuitry for improving the power supply rejection ratio.

50. The circuit of claim 49 wherein the circuitry for improving the power supply rejection ratio includes circuitry providing a first regulated voltage used to power at least a part of the voltage regulation circuit.

51. The circuit of claim 50 wherein the circuitry for improving the power supply rejection ratio includes circuitry for providing a second regulated voltage used to power the buffer circuit, wherein the second regulated voltage is greater than the first regulated voltage when the voltage booster isolation circuit disconnects the voltage regulation circuit from the buffer circuit.

52. An analog to digital conversion circuit having improved accuracy when converting an input signal from the analog domain to the digital domain; the analog to digital conversion circuit comprising:
 a digital to analog converter circuit having a plurality of switched capacitors;
 a voltage reference driver circuit coupled to the digital to analog converter circuit configured to provide a substantially constant output voltage to the plurality of switched capacitors, the voltage reference driver circuit comprising:
 a voltage regulation circuit that generates a substantially constant bias voltage;
 a buffer circuit providing the substantially constant output voltage based on a substantially constant boosted bias voltage; and
 a voltage booster isolation circuit coupled to the voltage regulation circuit and the buffer circuit for selectively disconnecting the buffer circuit from the voltage regulation circuit at or before the occurrence of a pulse induced by switching the plurality of switched capacitors, the voltage booster isolation circuit configured to provide the boosted bias voltage to the buffer circuit during a switching interval;
 wherein selectively disconnecting the buffer circuit substantially reduces or prevents the pulse from propagating back to the voltage regulation circuit, reducing drift on the substantially constant output voltage.

53. The analog to digital conversion circuit of claim 52 wherein the voltage booster isolation circuit comprises a first charge storage device having a first terminal with an increased voltage potential when the voltage booster isolation circuit disconnects the voltage regulation circuit from the buffer circuit.

54. The analog to digital conversion circuit of claim 52 wherein the voltage booster isolation circuit operates with respect to a control signal that is derived from a timing signal that controls the analog to digital converter.

55. The analog to digital conversion circuit of claim 52 wherein the voltage booster isolation circuit comprises:
 a first charge storage device having a first terminal with an increased voltage potential when the voltage booster isolation circuit disconnects the voltage regulation circuit from the buffer circuit, and
 a second charge storage device having a terminal connected to a second terminal of the first charge storage device.

56. The analog to digital conversion circuit of claim 52 wherein the boosted bias voltage exceeds a supply voltage.

57. The analog to digital conversion circuit of claim 52 wherein the voltage regulation circuit comprises a first transconductance element and a first resistor and a second resistor, and
 wherein the buffer circuit comprises a second transconductance element and a third resistor, and wherein the first, second and third resistors are proportioned such that the first and second transconductance elements have substantially the same current densities and terminal to terminal voltages during the switching interval.

58. The analog to digital conversion circuit of claim 52 wherein the voltage booster isolation circuit comprises a plurality of capacitors having a common node connected to an input node of the buffer circuit during the switching interval, and wherein the common node of the plurality of capacitors is charged to the substantially constant bias voltage generated by the voltage regulation circuit during a regulation interval.

* * * * *